(12) United States Patent
Heanue et al.

(10) Patent No.: US 10,180,537 B2
(45) Date of Patent: Jan. 15, 2019

(54) RGB COMBINER USING MEMS ALIGNMENT AND PLC

(71) Applicant: Kaiam Corp., Newark, CA (US)

(72) Inventors: John Heanue, Boston, MA (US); Bardia Pezeshki, Menlo Park, CA (US); Henk Bulthuis, Newark, CA (US)

(73) Assignee: Kaiam Corp., Newark, CA (US)

( * ) Notice: Subject to any disclaimer, the term of this patent is extended or adjusted under 35 U.S.C. 154(b) by 0 days.

(21) Appl. No.: 15/573,633

(22) PCT Filed: May 12, 2016

(86) PCT No.: PCT/US2016/032215
§ 371 (c)(1),
(2) Date: Nov. 13, 2017

(87) PCT Pub. No.: WO2016/183381
PCT Pub. Date: Nov. 17, 2016

(65) Prior Publication Data
US 2018/0128979 A1    May 10, 2018

Related U.S. Application Data

(60) Provisional application No. 62/160,492, filed on May 12, 2015.

(51) Int. Cl.
*G02B 6/12* (2006.01)
*G02B 6/42* (2006.01)
*H01S 5/022* (2006.01)

(52) U.S. Cl.
CPC ..... *G02B 6/12019* (2013.01); *G02B 6/12026* (2013.01); *G02B 6/4204* (2013.01); *G02B 6/4287* (2013.01); *H01S 5/02284* (2013.01)

(58) Field of Classification Search
None
See application file for complete search history.

(56) References Cited

U.S. PATENT DOCUMENTS

| | | | |
|---|---|---|---|
| 7,423,802 B2 | 9/2008 | Miller | |
| 8,542,959 B2 * | 9/2013 | Nakanishi | G02B 6/4249 385/14 |

(Continued)

FOREIGN PATENT DOCUMENTS

WO    WO 2012-039993 A2    3/2012

OTHER PUBLICATIONS

International Search Report on related PCT Application No. PCT/US2016/032215 from International Searching Authority (KIPO) dated Aug. 29, 2016.

(Continued)

*Primary Examiner* — Chad H Smith
(74) *Attorney, Agent, or Firm* — Klein, O'Neill & Singh, LLP (57) ABSTRACT

Light from discrete red, blue, and green lasers are combined into a single output using a planar lightwave circuit (PLC). In some embodiments some light from an output of the PLC is reflected back to the lasers, and in some embodiments the reflected light is primarily of one of the red, green, or blue wavelengths. In some embodiments multiple lasers of slightly differing wavelengths are provided as light sources for some or all of the red, blue, and green light.

12 Claims, 7 Drawing Sheets

(56) References Cited

U.S. PATENT DOCUMENTS

| | | | |
|---|---|---|---|
| 8,602,561 B2* | 12/2013 | Klein | G03B 21/14 353/20 |
| 8,971,376 B2 | 3/2015 | Pezeshki et al. | |
| 2011/0158272 A1 | 6/2011 | Pezeshki | |
| 2015/0103404 A1 | 4/2015 | Rudy et al. | |

OTHER PUBLICATIONS

Written Opinion on related PCT Application No. PCT/US2016/032215 from International Searching Authority (KIPO) dated Aug. 29, 2016.

* cited by examiner

RGB COMBINER USING MEMS ALIGNMENT AND PLC

CROSS-REFERENCE TO RELATED APPLICATION

This application is a national phase filing, under 35 U.S.C. § 371(c), of International Application No. PCT/US2016/032215, filed May 12, 2016, with claim of priority to U.S. Provisional Patent Application No. 62/160,492, filed on May 12, 2015, the disclosures of which are incorporated herein by reference in their entirety.

BACKGROUND OF THE INVENTION

The present invention relates generally to color display light sources, and more particularly to a light source combiner with laser light sources.

Color displays are often implemented using discrete red, green, and blue (RGB) light sources. These can be lamps, LEDs, or lasers. Lasers are particularly advantageous because they can be combined into a single-mode optical fiber, allowing an effective point RGB source for high-resolution applications. Often the lasers are combined using bulk optics that require complicated alignments and take up a lot of space. These assemblies can be difficult to keep aligned over a wide range of environmental conditions and over life of the assembly.

BRIEF SUMMARY OF THE INVENTION

Some embodiments in accordance with various aspects of the invention include a plurality of laser diodes, outputs of the laser diodes combinable to provide different colors in a spectrum of visible light; and a planar lightwave circuit configured to receive light of the laser diodes and combine at least some of the received light into an output, the planar lightwave circuit also configured to reflect some of the light about a particular wavelength in the visible spectrum back to at least one of the laser diodes.

In some embodiments in accordance with various aspects of the invention include a plurality of groups of lasers, each group of lasers including a plurality of lasers, with lasers of a first group of lasers configured to generate red light, lasers of a second group of lasers configured to generate green light, and lasers of a third group of lasers configured to generate blue light, with each of the plurality of lasers configured to generate light at different wavelengths, and with each of the plurality of laser separately activatable.

These and other aspects of the invention are more fully comprehended upon review of this disclosure.

DETAILED DESCRIPTION

Figure 1:
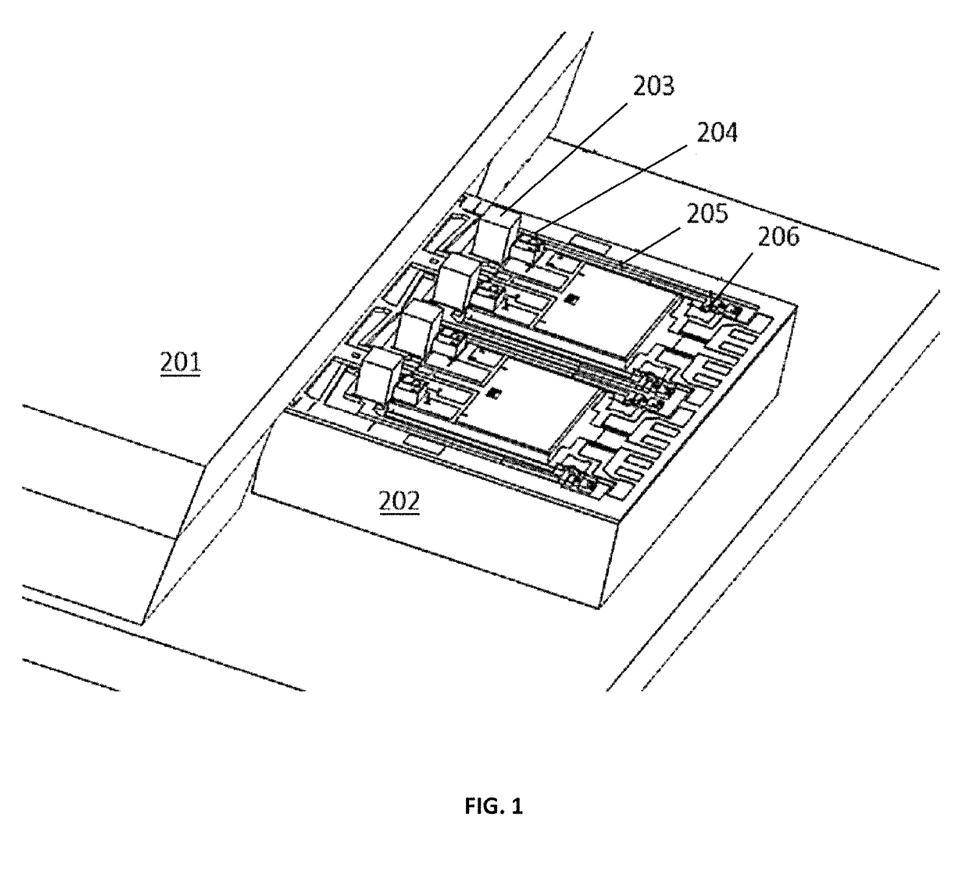
FIG. 1 shows an optical subassembly that combines four discrete laser diodes into a single-mode output using a Planar Light Circuit (PLC) combiner.

FIG. 1 shows an optical subassembly that combines four discrete laser diodes into a single-mode output using a Planar Light Circuit (PLC) combiner. The optical subassembly may be part of a MEMs packaging technology for combining lasers into a single fiber output. A PLC chip 201 has four input waveguides (not shown in FIG. 1) and contains a wavelength multiplexer such as an AWG (not shown) with a single output on the other side of the chip (not shown). The assembly contains four lasers 204 that emit light into four lenses 203, one lens per laser. The lens focuses the light and matches the mode to the input waveguides of the PLC 201. The lenses are mounted on a corresponding movable stage built on a silicon chip 202 using silicon MEMS (micro-electro-mechanical systems) techniques. Each movable stage is connected to a lever 205 that magnifies the motion of the lens. At the end of the lever is a heater 206 used to lock down the lever with the lens in the optimal position. The assembly process starts with bonding all the components on the MEMS chips 202. Each lens is separately aligned using the lever and the levers are locked with the heaters. This process can be a simple and high yield technique for aligning lasers to PLCs.

Figure 2:
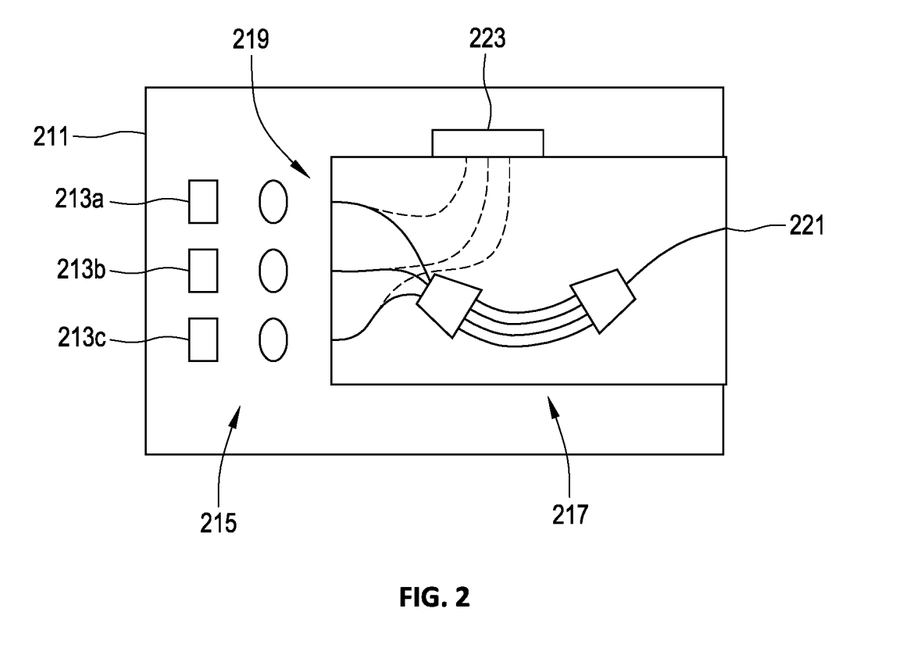
FIG. 2 illustrates a MEMs packaging platform providing an RGB combiner in accordance with aspects of the invention.

The MEMs packaging platform may be used to provide a compact, stable RGB combiner. The concept is illustrated in FIG. 2. Discrete red, green, and blue laser diodes (LDs) 213 are mounted on a substrate 211. Light from the discrete red, green, and blue laser diodes (LDs) are coupled into input waveguides 219 of a PLC 217 using microlenses 215. The microlenses may be mounted and adjusted as discussed with respect to FIG. 1. The PLC combines the light into a single output 221. The combiner can be based on an Arrayed Waveguide Grating (AWG) design or use directional couplers, for example. Optional tap waveguides can be included to direct a small fraction of the light in each input to monitor photodiodes 223. The output of the photodiodes can be used in a feedback loop to adjust the laser currents in order to maintain the desired output power for each color.

Figure 3:
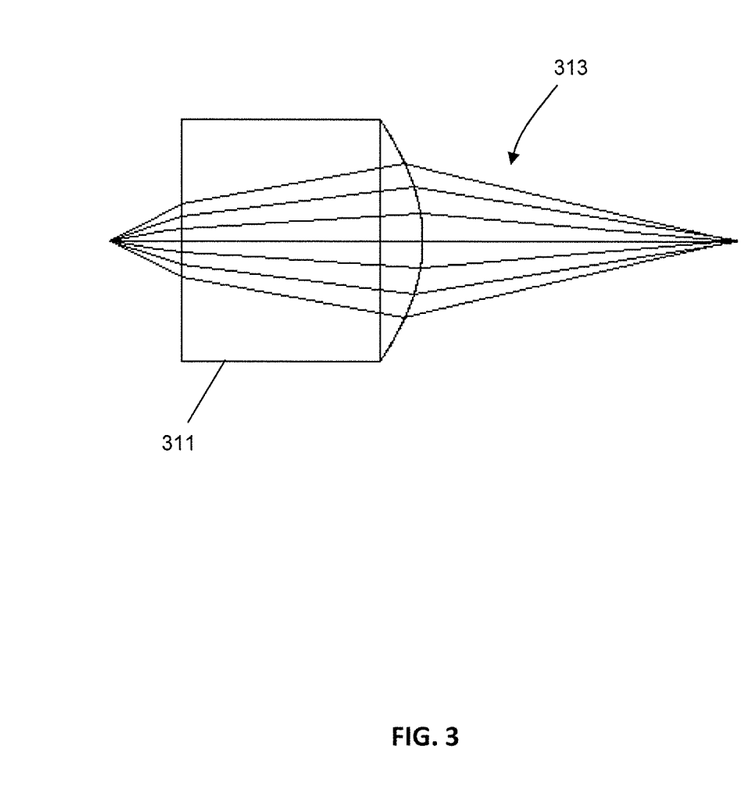
FIG. 3 illustrates an example lens design useful in embodiments in accordance with aspects of the invention.

In some embodiments, the microlenses are made in wafer form in silicon. For an RGB combiner, an alternate material may be preferred. While glass is used in some embodiments, it is advantageous to use a material that allows similar wafer-scale fabrication, and preferably has a high refractive index. One example is ZnS, which is transparent through the visible spectrum. An example lens 311 design is shown in FIG. 3, with optical paths 313 through the lens also illustrated. In some embodiments the lens has a 0.25 mm center thickness and 0.2 mm clear aperture. The sag of the lens surface is such that it can be readily manufactured using wafer-level etching processes.

One problem with a laser-based RGB combiner is that the laser wavelength drifts over temperature. Maintaining accurate color rendering may require temperature stabilization. Temperature stabilization may be provided by mounting the MEMs assembly on a thermoelectric cooler (TEC). A TEC, however, adds cost and consumes additional power, which can be a big disadvantage for portable consumer applications. An alternative approach is shown in FIG. 4.

Figure 4:
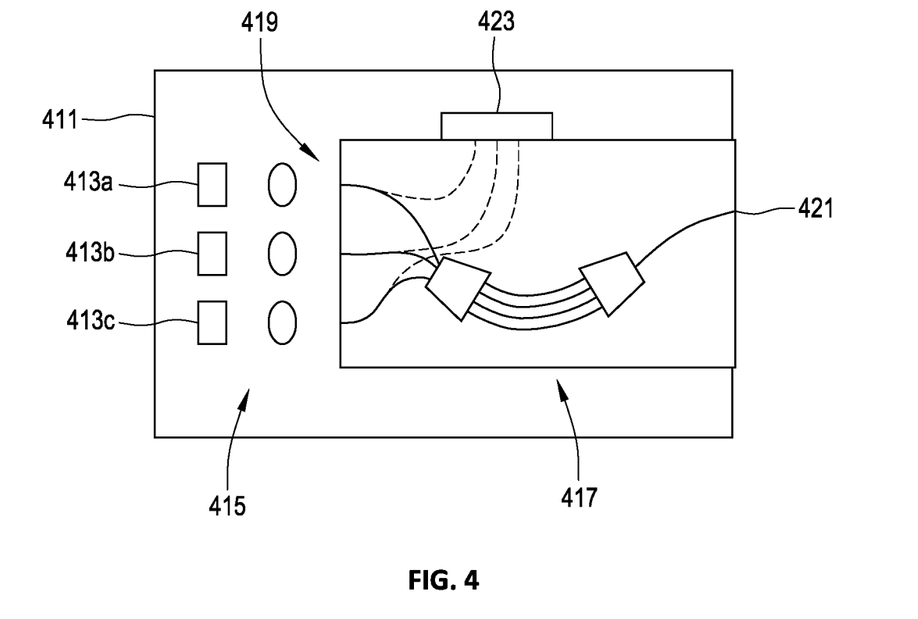
FIG. 4 illustrates a further embodiment of a MEMs packaging platform providing an RGB combiner in which laser diodes act as gain mediums for extended-cavity lasers, accordance with aspects of the invention.

FIG. 4 illustrates a further embodiment of a MEMs packaging platform used to provide an RGB combiner in accordance with aspects of the invention. Discrete red, green, and blue laser diodes (LDs) 413 are mounted on a substrate 411. Light from the discrete red, green, and blue laser diodes (LDs) are coupled into input waveguides 419 of a PLC 417 using microlenses 415. The microlenses may be mounted and adjusted as discussed with respect to FIG. 1. The PLC combines the light into a single output 421. The combiner can be based on an Arrayed Waveguide Grating (AWG) design or use directional couplers, for example. Optional tap waveguides can be included to direct a small fraction of the light in each input to monitor photodiodes 423. The output of the photodiodes can be used in a feedback loop to adjust the laser currents in order to maintain the desired output power for each color.

In the embodiment of FIG. 4, the laser diodes (LDs) are anti-reflection coated on their front (output) facets, with the LDs acting as the gain medium for an extended-cavity laser. Lasing is achieved by providing feedback from a partly-reflecting surface on the PLC, for example the output of the PLC. The lasing wavelength for each of the lasers is determined by the passband of the PLC. The PLC material is silica, which has low temperature dependence. The change in PLC passband wavelength is on the order of 0.01 nm/deg, an order of magnitude lower than that of the LDs, so that a TEC is not required.

Figure 5:
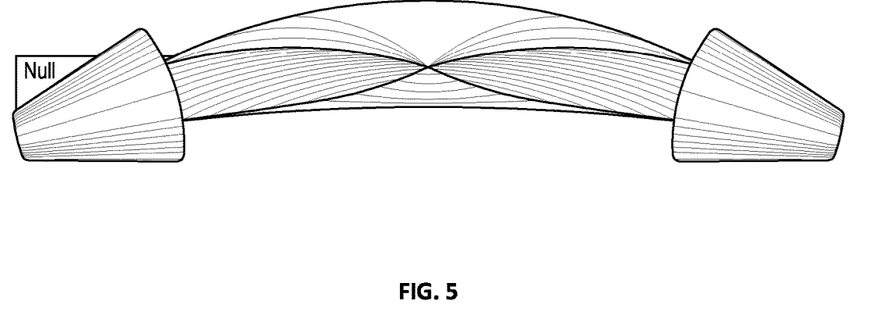
FIG. 5 illustrates an example PLC design in accordance with aspects of the invention.
Figure 6:
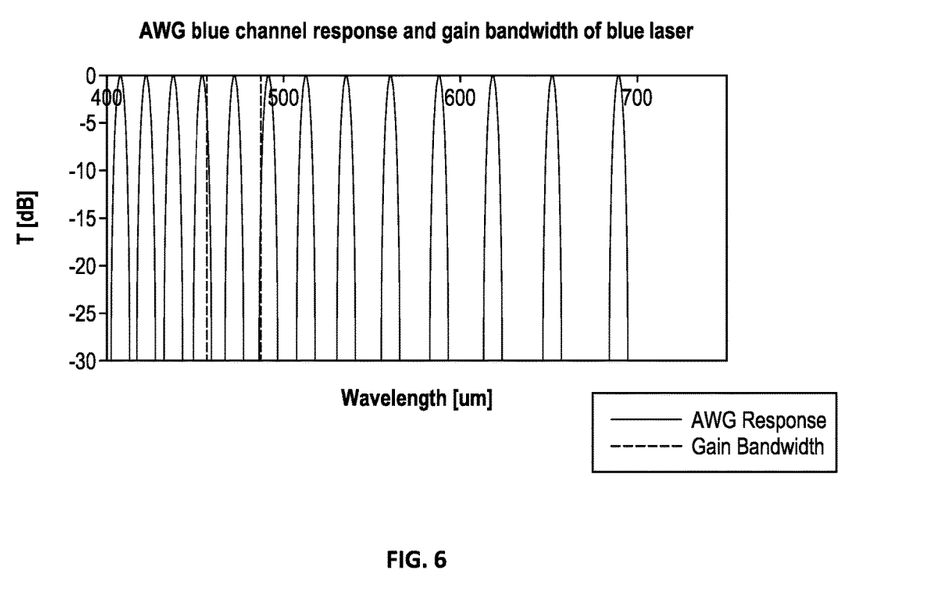
FIG. 6 illustrates an example spectrum for a channel of the PLC of FIG. 5.

An example PLC design is shown in FIG. 5. The design is AWG-based, with each color operating on a different order of the AWG. The Free Spectral Range (FSR) of the AWG is 25 THz. The overall size of the chip is less than 3 mm×10 mm. Waveguides are approximately 1 um×1 um with an index contrast of 1.5% giving a mode field diameter of about 2 um. In some embodiments segmented spotsize converters are used to facilitate coupling of light into and/or out of the PLC. In some such embodiments the mode field diameter may be larger, for example 4-6 um. As means of illustration, the spectrum of the filter for the blue channel is given in FIG. 6. The design of the filter is such that only one peak falls within the gain bandwidth of the lasing medium. This prevents excitation of the laser outside the target wavelength range. In practice, it may be desirable to use gain chips with broader gain spectra. In this case, the FSR of the AWG can be increased; however, the resulting footprint will increase. An alternative implementation is to incorporate a post-filter in the PLC design. This secondary filter can be implemented as a wavelength-dependent direction coupler or any other suitable broadband filter.

Though lasing through the PLC stabilizes the wavelength, it does reduce the output power. This is because any coupling loss between the semiconductor and PLC and any loss due to the PLC becomes an intra-cavity loss, amplified by the Q of the cavity, rather than simply a proportional loss on the output power. Furthermore, this intracavity loss increases the laser threshold which makes the laser less efficient. The modal structure of the laser also changes, as the cavity length becomes much larger. So ideally, one may want some subset of the three lasers to include the PLC in the cavity to stabilize the wavelength, and the other lasers to function independent of the PLC and only use the PLC to combine the output. For example, given the human eye characteristics and the temperature dependence of the lasers, the red laser is the most susceptible to perceived color change with temperature. So in some embodiments the AR coating on the output of the PLC is to be a minimum in the blue and green wavelengths, but partially reflecting in the red. Similarly, the red laser diode would be AR coated to act as a gain element only, while the green and blue laser diodes would be partially reflective on their output facets.

The MEMs packaging technology discussed herein allows for incorporation of additional channels. In general, additional channels may be added, so long as the chip footprint can accommodate the space. Furthermore, the alignment yield is high, so it is possible to implement assemblies with 10 or more channels while still maintaining reasonable overall yield.

Figure 7:
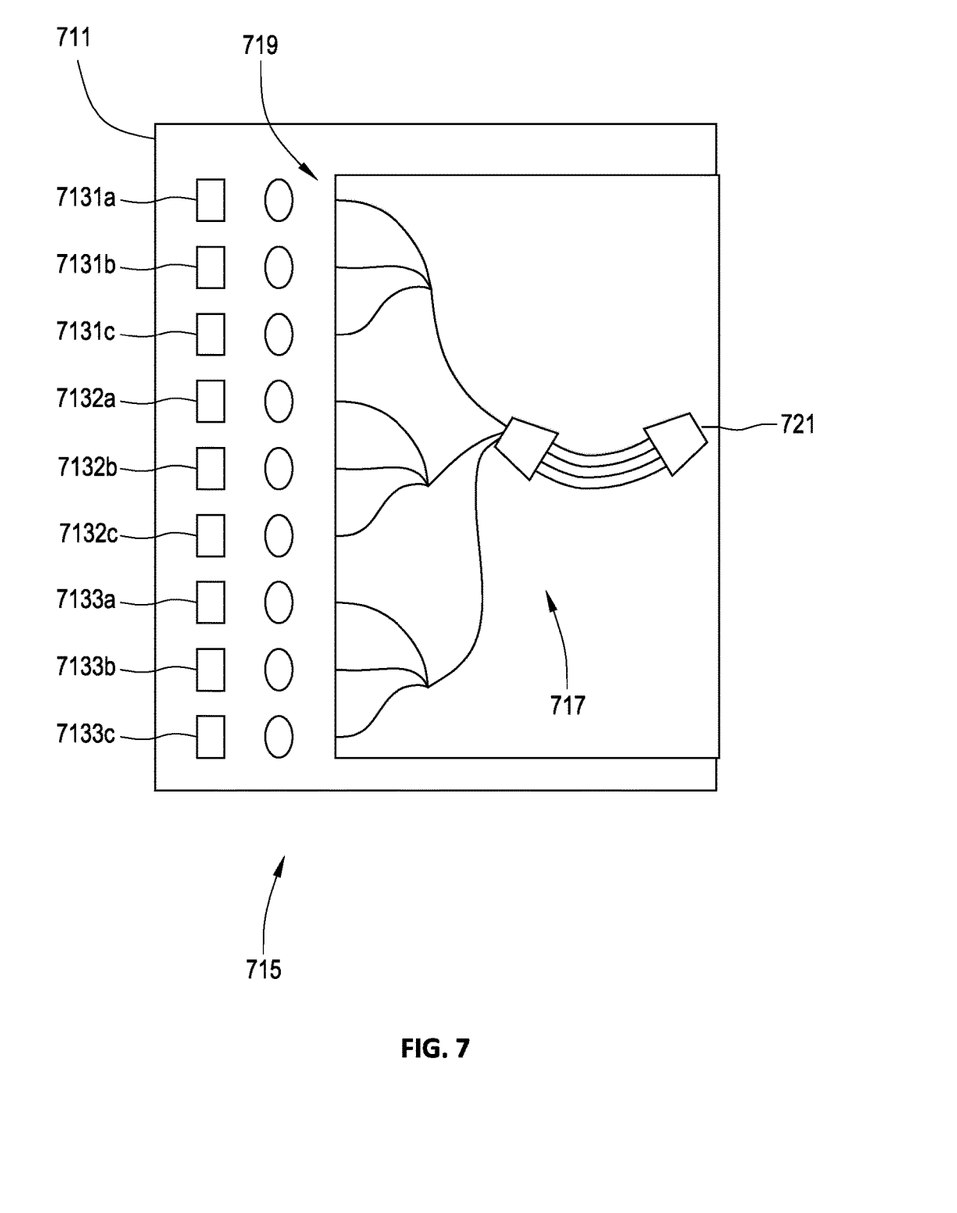
FIG. 7 illustrates a further embodiment of a MEMs packaging platform providing an RGB combiner in accordance with aspects of the invention.

An alternate way of making a wavelength-stabilized source is shown in FIG. 7. The embodiment of FIG. 7 is similar to that of FIG. 4. In the embodiment of FIG. 7, however, groups of lasers are used for each color. In the embodiment of FIG. 7 groups of discrete red LDs 7131a-α, green LDs 7132a-c, and blue LDs 7133a-c mounted on a substrate 711. Light from the discrete red, green, and blue laser diodes (LDs) are coupled into input waveguides 719 of a PLC 717 using microlenses 715. The microlenses may be mounted and adjusted as discussed with respect to FIG. 1. The PLC combines the light into a single output 721. The combiner can be based on an Arrayed Waveguide Grating (AWG) design or use directional couplers, for example. Although not illustrated in FIG. 7, in some embodiments optional tap waveguides can be included to direct a small fraction of the light in each input to monitor photodiodes, with the output of the photodiodes used in a feedback loop to adjust the laser currents in order to maintain the desired output power for each color.

The lasers within each group are chosen such that, at a nominal temperature, their wavelengths vary by a small amount. Based on the measured temperature (for example as measured by a circuit (not shown) with temperature dependent operation), a different laser of a group can be turned on, for example by laser control circuitry (not shown). For example, a low wavelength laser within a group can be used when the temperature is at the high range, while a mid-wavelength laser is used at mid-temperature and a high-wavelength laser is used at low temperature. Alternatively, a plurality, which may be all, lasers of a group can be turned on simultaneously and their relative powers adjusted to provide a desired color balance.

The ability to integrate more channels in a relatively straightforward manner can also be used to achieve higher-power sources. A given application may benefit from high output power, but there may not be an appropriate LD available to deliver such power. In this case multiple chips can be used to increase the power within each color band.

In some embodiments an AWG with closely spaced transmission wavelengths from adjacent waveguides is used in providing high output power. Similar gain chips are coupled to these channels and all lase within the PLC, as described previously. The output of the PLC will be a narrow comb where each of the gain chips lase in one of the closely spaced transmission wavelengths. But all the light is emitted from the single output of the PLC.

Some embodiments in accordance with various aspects of the invention include one, some or all of the foregoing:

Some embodiments in accordance with aspects of the invention include an RGB combiner which uses MEMs coupling of light between laser diodes and a PLC. In some embodiments an RGB combiner uses ZnS microlenses in coupling light between laser diodes and a PLC. In some embodiments the RGB combiner is a wavelength-stabilized RGB combiner, with one or all of the channels (e.g. color) lasing through the PLC, with the PLC providing at least part of a cavity of an external-cavity laser. In some embodiments wavelength-stabilization is provided through use of selectable inputs, for example separately activatable. In some embodiments high-power source is provided, using multiple laser chips, where some or all of the lasers lase through the PLC.

Although the invention has been discussed with respect to various embodiments, it should be recognized that the invention comprises the novel and non-obvious claims supported by this disclosure.

What is claimed is:

1. A device useful as a color display light source, comprising:
    a plurality of laser diodes, outputs of the laser diodes combinable to provide different colors in a spectrum of visible light; and
    a planar lightwave circuit (PLC) configured to receive light of the laser diodes and combine at least some of the received light into an output, the planar lightwave circuit also configured to reflect some of the received light about a particular wavelength in the visible spectrum back to at least one of the laser diodes; and
    wherein a first of the laser diodes comprises a first laser diode configured to generate a red light, a second of the laser diodes comprises a second laser diode configured to generate a green light, and a third of the laser diodes comprises a third laser diode configured to generate a blue light; and
    further comprising a plurality of lenses positioned to couple light from the laser diodes to the PLC;
    wherein each of the plurality of lenses are on a respective lever that magnifies motion of the lens.

2. The device of claim 1, wherein the particular wavelength in the visible spectrum is a wavelength for red light.

3. The device of claim 2, wherein the first of the laser diodes includes an anti-reflective coating on a front output facet.

4. The device of claim 3, wherein the second and third of the laser diodes are at least partially reflective on their front output facets.

5. The device of claim 4, wherein the first laser diode provide a gain medium for an external cavity laser.

6. The device of claim 2, wherein the PLC is configured to reflect the at least some of the received light using a partly reflecting surface on an output of the PLC.

7. The device of claim 1, wherein each lens is a ZnS lens.

8. The device of claim 1, wherein the plurality of laser diodes comprise at least part of a first group of lasers configured to each generate a red light at a slightly different wavelength, a second group of lasers configured to each generate a green light at a slightly different wavelength, and a third group of lasers configure to each generate a blue light at a slightly different wavelength.

9. The device of claim 8, wherein each laser in a group of lasers is separately activatable.

10. The device of claim 1, wherein the PLC comprises an arrayed waveguide grating (AWG).

11. A device useful as a color display source, comprising:
    a plurality of groups of lasers, each group of lasers including a plurality of lasers, with lasers of a first group of lasers configured to generate red light, lasers of a second group of lasers configured to generate green light, and lasers of a third group of lasers configured to generate blue light, with each of the plurality of lasers configured to generate light at different wavelengths, and with each of the plurality of laser separately activatable;
    wherein each of the lasers comprise an external-cavity laser with a laser diode for each of the lasers serving as a gain medium.

12. The device of claim 11, wherein a planar lightwave circuit (PLC) provides at least part of a cavity for the external-cavity lasers.

* * * * *